(12) United States Patent
Jang

(10) Patent No.: US 6,458,653 B1
(45) Date of Patent: Oct. 1, 2002

(54) METHOD FOR FORMING LOWER ELECTRODE OF CYLINDER-SHAPED CAPACITOR PREVENTING TWIN BIT FAILURE

(75) Inventor: Se-Myeong Jang, Kyungki-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 10/040,866

(22) Filed: Dec. 27, 2001

(30) Foreign Application Priority Data

Jan. 5, 2001 (KR) .............................. 2001-674

(51) Int. Cl.[7] ......................................... H01L 21/8242
(52) U.S. Cl. ....................................... 438/253; 438/396
(58) Field of Search ........................... 438/3, 240, 253, 438/254, 255, 396, 397, 398

(56) References Cited

U.S. PATENT DOCUMENTS 6,218,244 B1 * 4/2001 Chan et al. ................. 438/253
6,232,175 B1 * 5/2001 Liu et al. .................... 438/253
6,284,595 B1 * 9/2001 Kato .......................... 438/253
6,329,683 B2 * 12/2001 Kohyama .................... 257/306

* cited by examiner

Primary Examiner—Tuan H. Nguyen
(74) Attorney, Agent, or Firm—Marger Johnson & McCollom, P.C.

(57) ABSTRACT

A method for forming a lower electrode of a cylinder-shaped capacitor is provided to prevent etch skew and twin bit failure. The method includes sequentially forming a buffer layer and an etch stopper on a semiconductor substrate including a conductive region, forming a sacrificial dielectric layer on the etch stopper, forming a first opening within the sacrificial dielectric layer by etching a portion of the sacrificial dielectric layer using the etch stopper, depositing a slope-improving layer for improving sidewall slope of the first opening, forming a second opening by etching a portion of the slope-improving layer, the etch stopper and the buffer layer under the first opening and exposing the conductive region to which the cylinder-shaped capacitor is electrically connected, depositing a conductive layer for forming cylinder-shaped lower electrodes on a surface of the second opening, and forming the cylinder-shaped lower electrodes separated from each other.

20 Claims, 11 Drawing Sheets

METHOD FOR FORMING LOWER ELECTRODE OF CYLINDER-SHAPED CAPACITOR PREVENTING TWIN BIT FAILURE

This application relies for priority upon Korean Patent Application No. 2001-674, filed on Jan. 5, 2001, the contents of which are herein incorporated by reference in their entirety.

BACKGROUND OF THE INVENTION

1. Field of the Invention

The present invention relates to a method for manufacturing a semiconductor device, and more particularly, to a method for forming lower electrodes of a cylinder-shaped capacitor of a memory device or a merged DRAM logic (MDL) device.

2. Description of the Related Art

As the integration density of semiconductor devices increases, design rule decreases. In particular, as a memory device such as a dynamic random access memory (DRAM) rapidly becomes highly-integrated and as its pattern becomes increasingly fine, the pitch between lower electrodes of a capacitor decreases. However, the capacitance required to drive the DRAM does not decrease at the same rate as the pitch decreases because of problems such as soft error.

Consequently, in most DRAMs, a method for making capacitors applied in DRAMs three-dimensional is used to increase the capacitance. Three-dimensional capacitors include pin-shaped capacitors, trench-shaped capacitors, stack-shaped capacitors, and cylinder-shaped capacitors, and among these, the cylinder-shaped capacitor is most widely used.

FIGS. 1 and 2 are sectional views showing a conventional method for forming lower electrodes of a cylinder-shaped capacitor, and FIG. 3 is a plan view illustrating a conventional method for forming lower electrodes of a cylinder-shaped capacitor. Referring to FIG. 1, a lower structure (not shown for simplicity), such as a transistor and a bit line, is formed on a semiconductor substrate 10, and an interlevel dielectric (ILD) film 12 is deposited on the semiconductor substrate 10. Buried contacts (BC) 14 as a conductive region connected to the cylinder-shaped capacitor are formed on the semiconductor substrate 10. Next, a buffer layer 16 and an etch stopper 18 are sequentially formed on the resultant structure.

Next, a sacrificial oxide layer 20 for forming the cylinder-shaped capacitor is formed on the etch stopper 18. Subsequently, an etching process using a photoresist pattern 22 is performed on the sacrificial oxide layer 20 to form a first opening 24 therein as a region where the cylinder-shaped capacitor is formed.

However, during etching of the sacrificial oxide layer 20 to form the first opening 24, because etch by-products 26 are formed at the top of the first opening 24, etch skew (a dotted part of A) in which anisotropic dry etching forms a first opening 24 that is curved instead of straight occurs.

Referring to FIG. 2, the etch stopper 18 and the buffer layer 16 are further etched on the semiconductor substrate 10 where the etch skew occurs, and the first opening 24 further extends downwards, thereby exposing an upper part of the BC 14 as a conductive region to be electrically connected to the cylinder-shaped capacitor.

Subsequently, a conductive layer for forming cylinder-shaped lower electrodes 28 is deposited on the semiconductor substrate 10. Subsequently, a chemical-mechanical polishing (CMP) process is performed on the resultant structure to remove a portion of the conductive layer for forming the cylinder-shaped lower electrodes 28 that is disposed on the sacrificial oxide layer 20, thereby separating the cylinder-shaped lower electrode 28. Lastly, the sacrificial oxide layer 20 is removed by wet etching to complete the lower electrodes 28 of the cylindershaped capacitor.

FIG. 3 is a plan view illustrating the cylinder-shaped lower electrodes 28 formed in accordance with the processing steps described above. The left side of FIG. 3 shows four cylinder-shaped lower electrodes 28 formed on a predetermined region of the semiconductor substrate 10 before integration density increases. The right side of FIG. 3, which has the same area as the left side, shows five cylinder-shaped lower electrodes 28 formed on the semiconductor substrate 10 after the integration density has increased. As the integration density increases, the pitch between cylinder-shaped lower electrodes is reduced from t1 to t2, and the probability of twin bit failure increases. In twin bit failure, a bridge between neighboring cylinder-shaped lower electrodes at the top of the cylinder-shaped lower electrodes occurs in proportion to the reduced degree.

The conventional methods for forming a cylinder-shaped capacitor have the following problems.

First, as a memory device such as a DRAM becomes highly-integrated, the number of capacitors formed in a certain area increases. Thus, the spacing between cylinder-shaped lower electrodes decreases, and the probability of twin bit failure increases.

Second, the probability of a bridge occurring between neighboring cylinder-shaped lower electrodes, even at the middle of the cylinder-shaped lower electrodes, increases due to etch skew. Furthermore, as the integration density of a DRAM increases, the height of the cylinder-shaped lower electrodes becomes greater. Thus, the probability of the cylinder-shaped lower electrodes falling down, twin bit failure, or micro-bridge formation, increases.

SUMMARY OF THE INVENTION

To solve the above problems, the present invention contemplates a method for forming a lower electrode of a cylinder-shaped capacitor in which etch skew or twin bit failure can be prevented by applying a slope-improving layer for improving sidewall slope before the formation of the lower electrodes of the capacitor.

Accordingly, according to one embodiment of the present invention, a buffer layer and an etch stopper are sequentially formed on a semiconductor substrate including a conductive region. A sacrificial dielectric layer is formed on the etch stopper. A first opening is formed within the sacrificial oxide layer by etching a portion thereof using the etch stopper. A slope-improving layer for improving sidewall slope of the first opening is formed on the resultant structure. A second opening is then formed by etching a portion of the slope-improving layer, the etch stopper and the buffer layer under the first opening. The second opening exposes the conductive region to which the cylinder-shaped capacitor is electrically connected. A conductive layer for forming cylinder-shaped lower electrodes is deposited on the resultant structure including the second opening. The cylinder-shaped lower electrodes are then formed separated from each other.

According to the present invention, the slope-improving layer for improving sidewall slope having excellent gap-fill characteristics is further formed after the first opening for forming a cylinder-shaped capacitor is formed and improves etch slope of the first opening. Also, the etch profile for a region in which etch skew occurs is improved, and the space between cylinder-shaped lower electrodes is increased, thereby preventing twin bit failure.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

FIGS. 4 through 13 are diagrams illustrating a method for forming a lower electrode of a cylinder-shaped capacitor according to the present invention.

Figure 1:
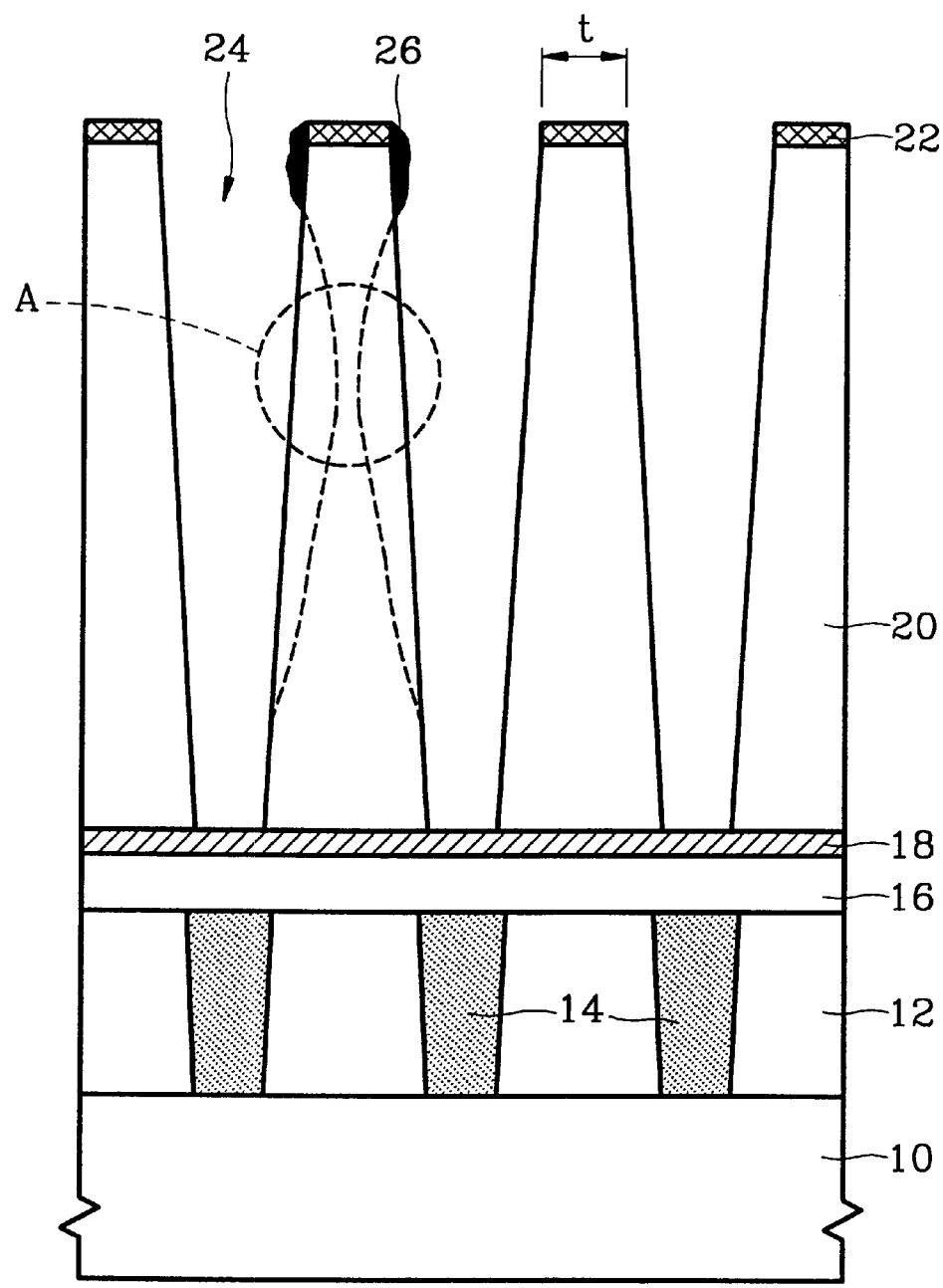
FIGS. 1 and 3 are diagrams illustrating a method for forming a lower electrode of a cylinder-shaped capacitor according to the prior art and problems thereof.
Figure 2:
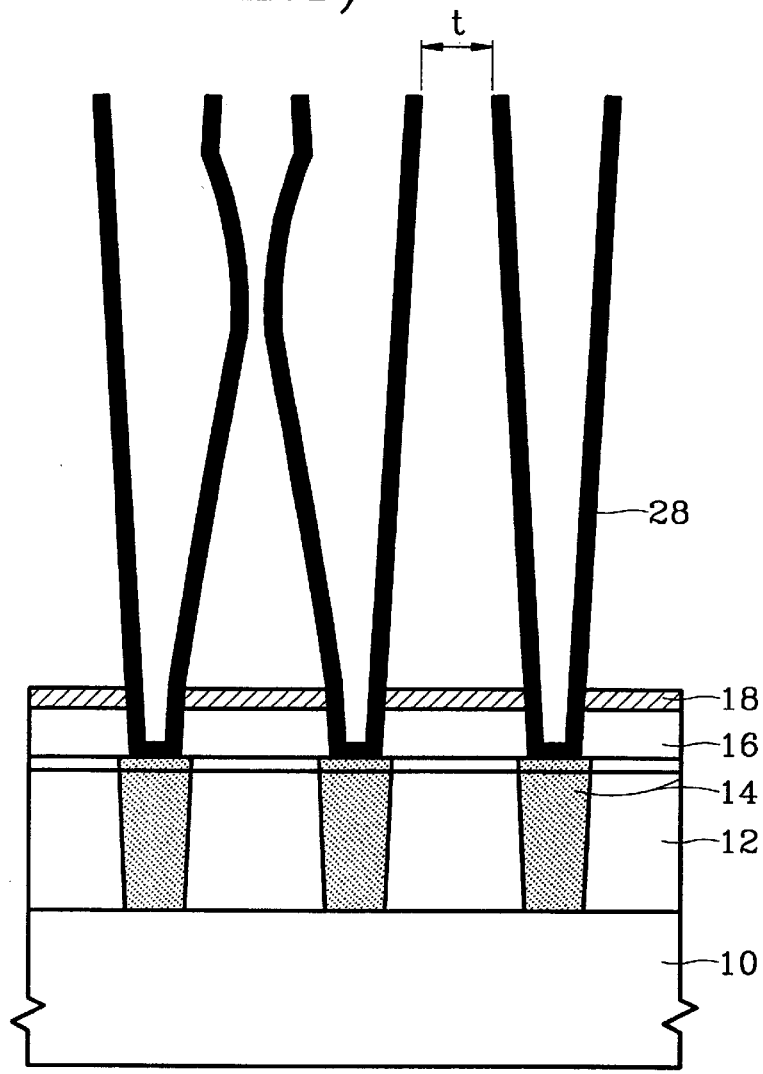
Figure 3:
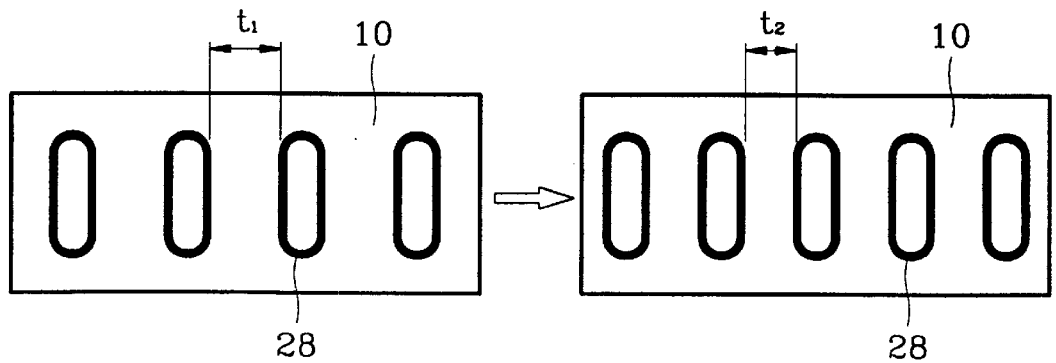
Figure 4:
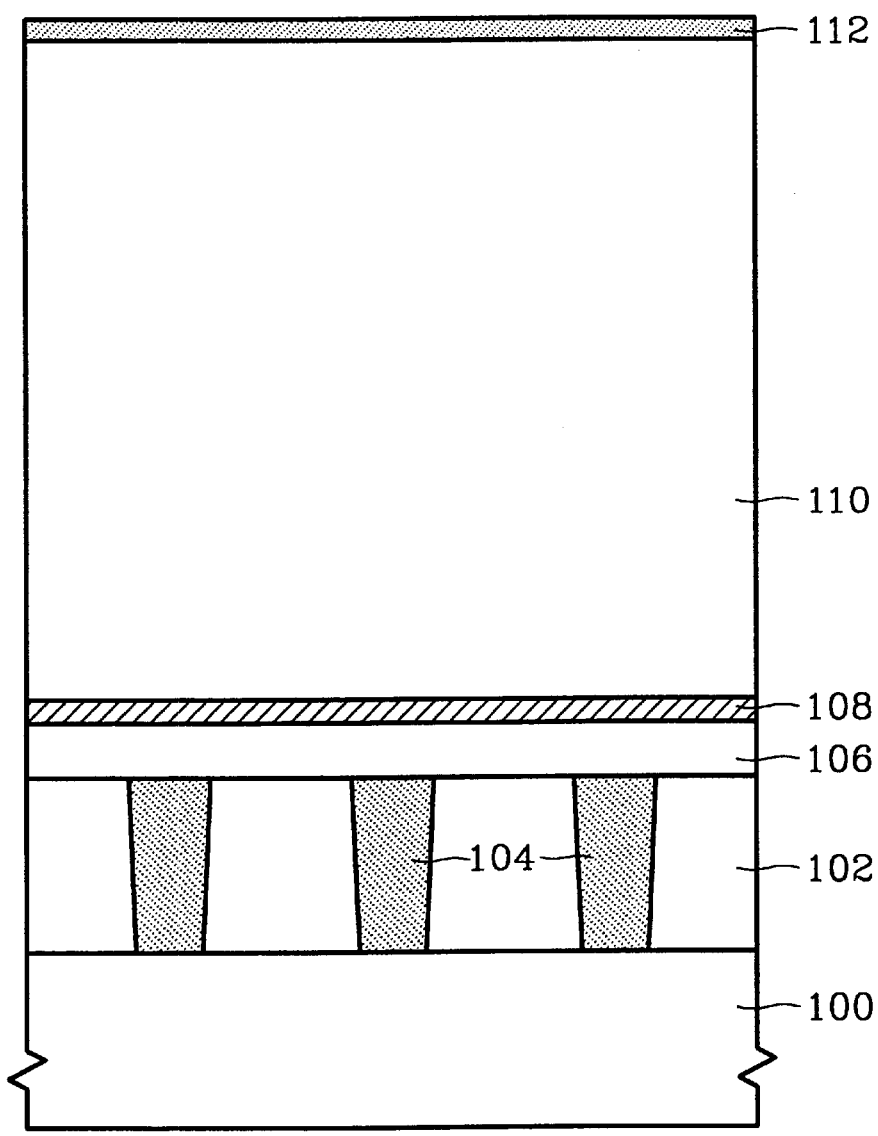
FIGS. 4 through 13 are diagrams illustrating a method for forming a lower electrode of a cylinder-shaped capacitor according to the present invention.

Referring FIG. 4, a lower structure such as a transistor or a bit line is formed on a semiconductor substrate 100 by a conventional method. Subsequently, an interlevel dielectric (ILD) film 102 formed of a dielectric material such as oxide is formed on the semiconductor substrate 100. Next, a buried contact (BC) opening is formed through the ILD film 102 using conventional techniques such as photolithography and etching. A conductive material, for example, doped-polysilicon or tungsten, is deposited over the ILD film 102 and within the BC opening. Then, a planarization process such as a chemical mechanical polishing (CMP) process is performed thereon to complete a BC 104.

Subsequently, a buffer layer 106 comprising a dielectric material such as plasma enhanced tetraethylorthosilicate (PE-TEOS), and an etch stopper 108 having an etch selectivity to a sacrificial dielectric layer to be formed thereon such as a sacrificial oxide layer 110 are sequentially formed overlying the BC 104. Preferably, the etch stopper 108 comprises a silicon nitride layer (SiN) if the sacrificial oxide layer 110 comprises PE-TEOS.

Next, the sacrificial oxide layer 110, for example, a single layer of PE-TEOS or a multilayer including the PE-TEOS layer, is formed on the etch stopper 108. A polysilicon layer is preferably formed on the sacrificial oxide layer 110 as an etching mask 112. An anti-reflection layer comprising a silicon oxynitride layer (SiON) or another anti-reflection layer is additionally formed on the polysilicon etching mask 112.

Figure 5:
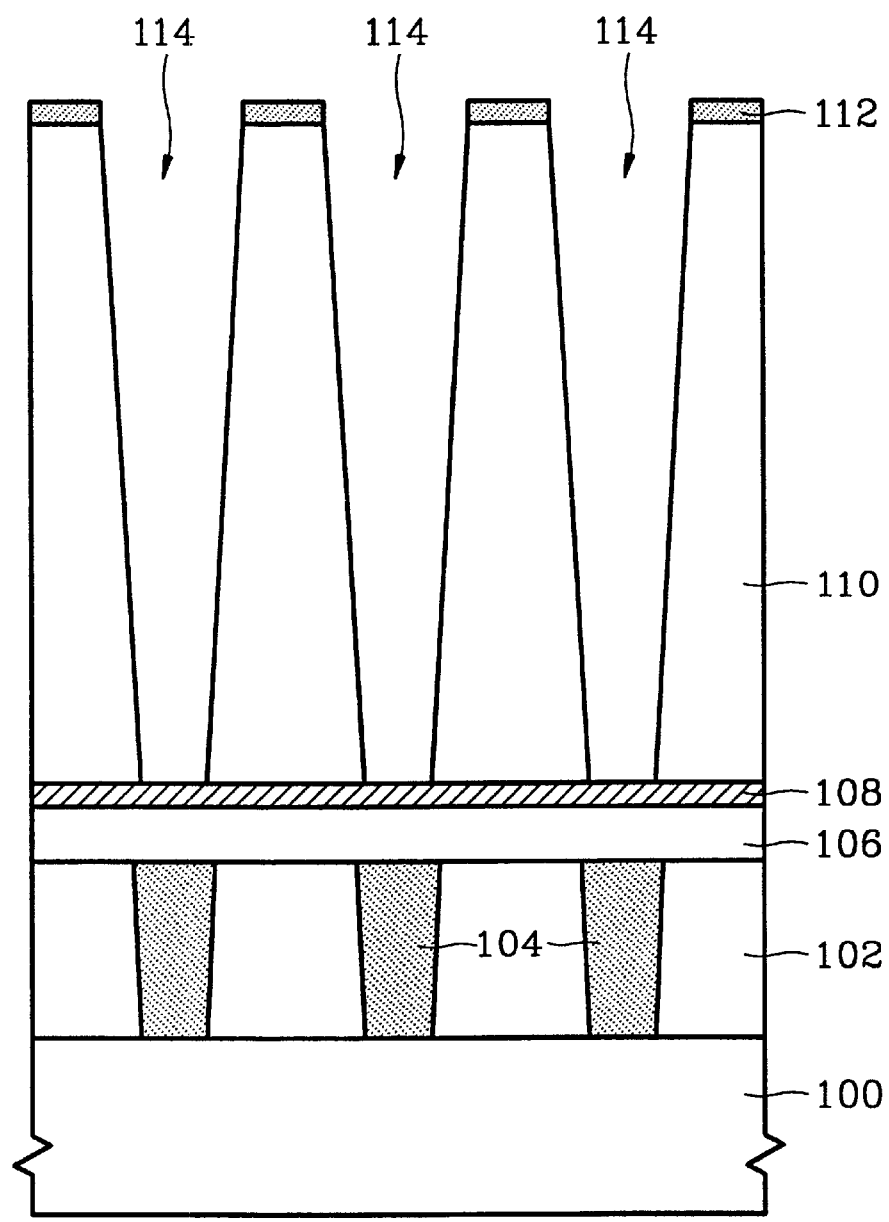

Referring to FIG. 5, a first opening 114 for forming a cylinder-shaped capacitor is then formed within the sacrificial oxide layer by photolithography and etching. Preferably, the sacrificial oxide layer 110 is etched by a dry etching method using the polysilicon etching mask 112. In order to prevent over etch, it is desirable that the etching stop at the etch stopper 108.

Figure 6:
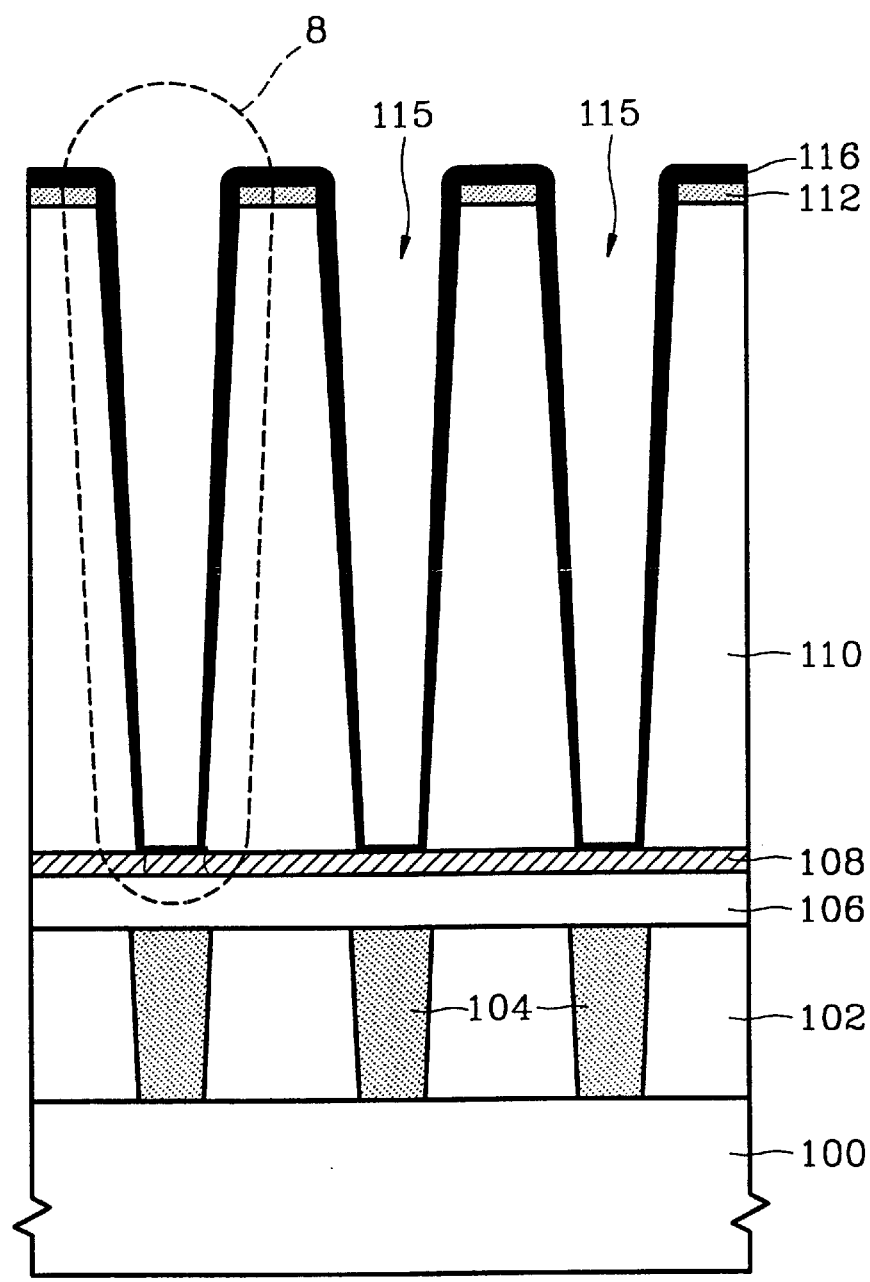

Referring to FIG. 6, a slope-improving layer 116 for improving sidewall slope is deposited to a thickness of about 50–500 Å, for example, 300 Å, over the resultant structure including the first opening 114.

The layer 116 for improving sidewall slope is preferably an undoped silicate glass (USG) layer formed by a chemical vapor deposition (CVD) method to have excellent gap-fill characteristics and improves the etch slope of dry etching to form the first opening 114. The layer 116 improves the etch profile for a region in which etch skew occurs, and thus prevents twin bit failure caused between cylinder-shaped lower electrodes to be formed. It is desired that the layer 116 for improving sidewall slope have excellent gap-fill characteristics. Thus, the layer 116 can be formed of any material having excellent gap-fill characteristics. Other layers such as a high-density plasma (HDP) oxide layer also can be used instead of the USG layer as the layer 116 for improving sidewall slope. Reference numeral 115 denotes a first opening after the formation of the layer 116 for improving sidewall slope.

Figure 7:
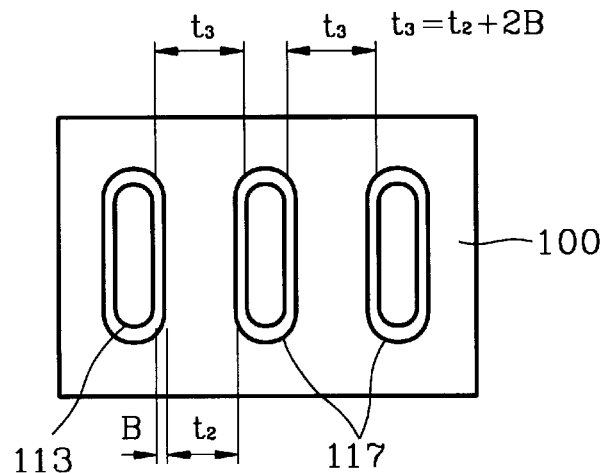

FIG. 7 is a plan view of the semiconductor substrate 100 before and after the formation of the layer 116 for improving sidewall slope according to an embodiment of the present invention. In detail, the outer line 117 of the first opening 114 shows the edge of the first opening 114 before the formation of the layer 116, and the inner line 113 shows the edge of the first opening 115 after the deposition of the layer 116 for improving sidewall slope.

That is, before the deposition of the layer 116 for improving sidewall slope, the pitch between cylinder-shaped lower electrodes (122 of FIG. 12) is $t_2$, but after the deposition of the layer 116 for improving sidewall slope, the pitch between cylinder-shaped lower electrodes 122 is increased to $t_3$. If the thickness of the layer 116 for improving sidewall slope at the top of the first opening is $\beta$, then $t_3=t_2+2\beta$. Twin bit failure can be prevented by the pitch between cylinder-shaped lower electrodes having a value of $2\beta$ when more cylinder-shaped lower electrodes are formed within a limited area.

Figure 8:
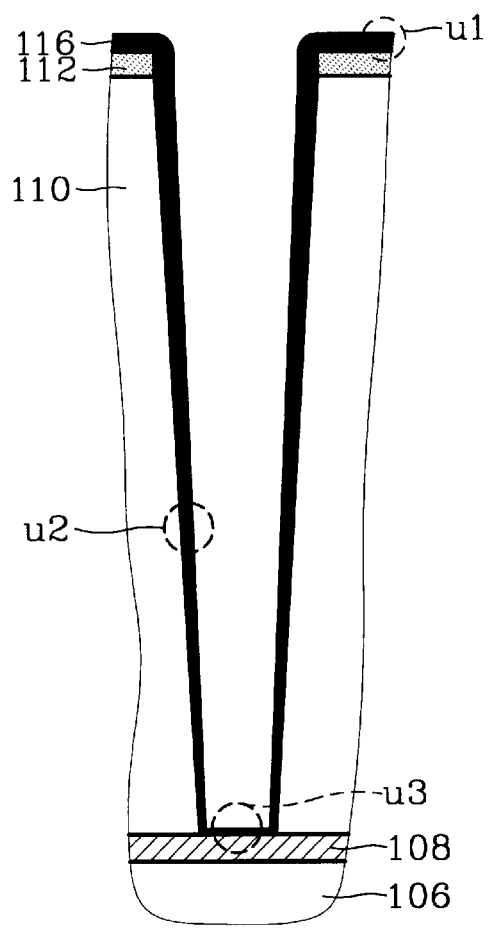

FIG. 8 is an enlarged sectional view of 8 of FIG. 6. In detail, the layer 116 for improving sidewall slope deposited by the CVD method has excellent gap-fill characteristics when it is deposited in the first opening 114. The layer 116 for improving sidewall slope is not necessarily deposited to a uniform thickness in the first opening, instead its thickness varies, for example, from u1 at the top, u2 at the middle, and u3 at the bottom of the first opening.

As one example, if the layer 116 for improving sidewall slope having a thickness of 300 Å is deposited at the top u1 of the first opening, the thickness of the layer 116 for improving sidewall slope deposited at the middle u2 of the first opening is 70–80 Å, and the thickness of the layer 116 for improving sidewall slope deposited at the bottom u3 of the first opening is less than 30 Å. As a result, the thickness to which the layer 116 for improving sidewall slope is deposited in the first opening 114 varies depending in which area it is deposited. With this feature of the layer 116, the etch slope of the first opening is improved.

Figure 9:
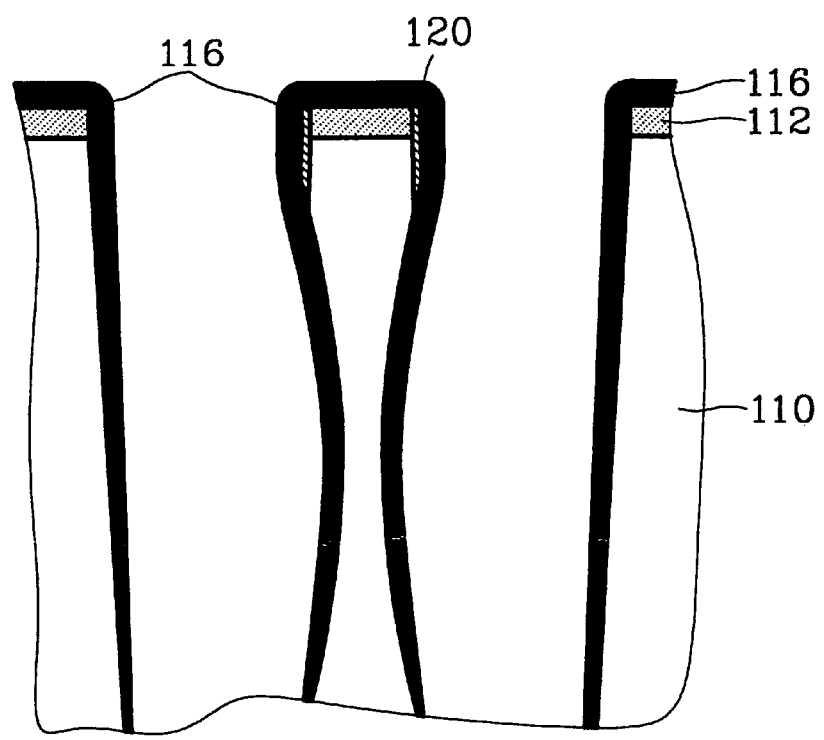

FIG. 9 is a sectional view illustrating the layer 116 for improving sidewall slope when etch skew occurs in FIG. 6. In detail, even though etch by-products 120 caused by dry etching are formed at the top of the first opening and etch skew occurs, the layer 116 for improving sidewall slope having excellent gap-fill characteristics compensates a region in which the etch skew occurs. This feature improves the profile of the region of the first opening in which the etch skew occurs. Thus, at the middle of the cylinder-shaped lower electrode, the layer 116 for improving sidewall slope according to the present invention can prevent twin bit failure or a micro-bridge.

Figure 10:
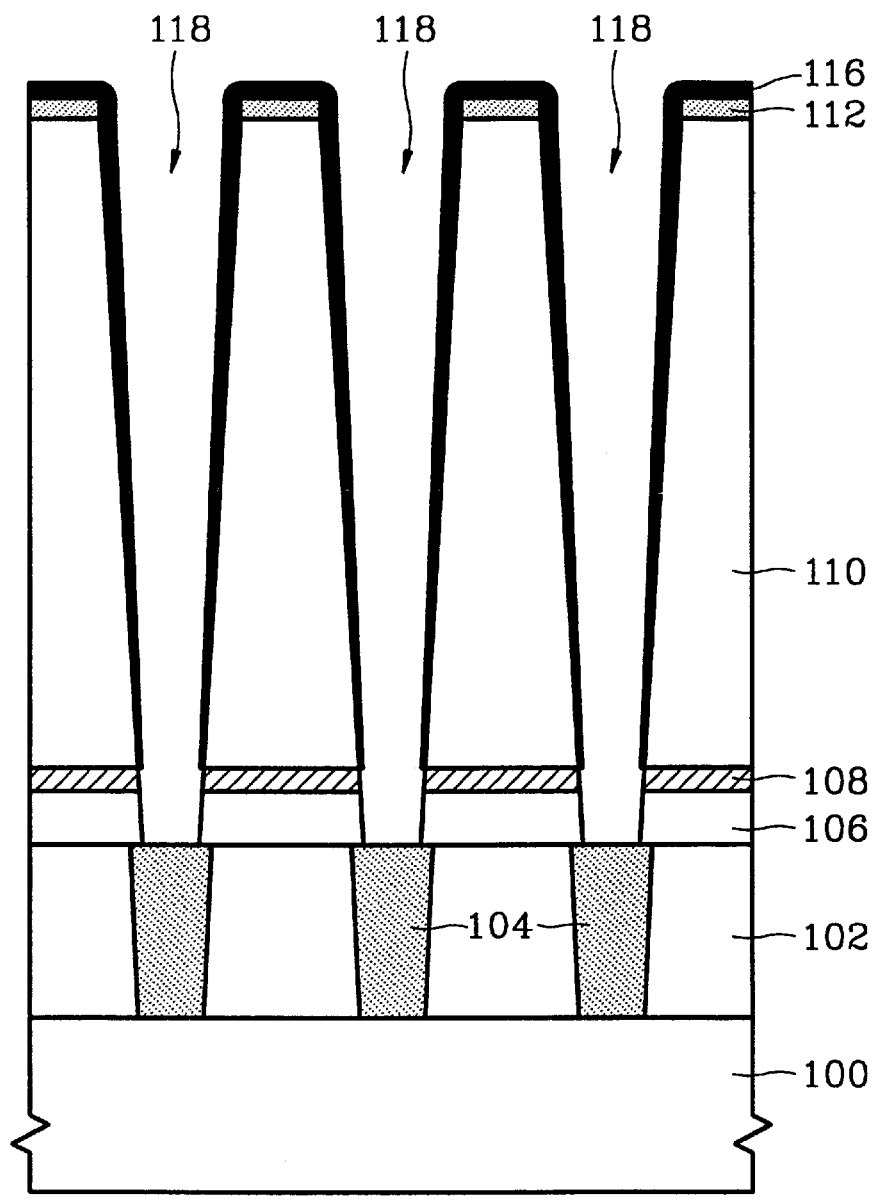

Referring to FIG. 10, a portion of the layer 116 at the bottom u3 of the first opening 114, the etch stopper 108, and the buffer layer 106 adjacent to the first opening are removed by etching. Thus, a second opening 118 is formed to expose the buried contact (BC) 104 (a conductive region) to which the cylinder-shaped lower electrode is electrically connected.

The conductive region exposed by the second opening 118 may be the top surface of the BC 104. The conductive region may be a source region of a transistor of a lower structure instead of the buried contact (BC).

Figure 11:
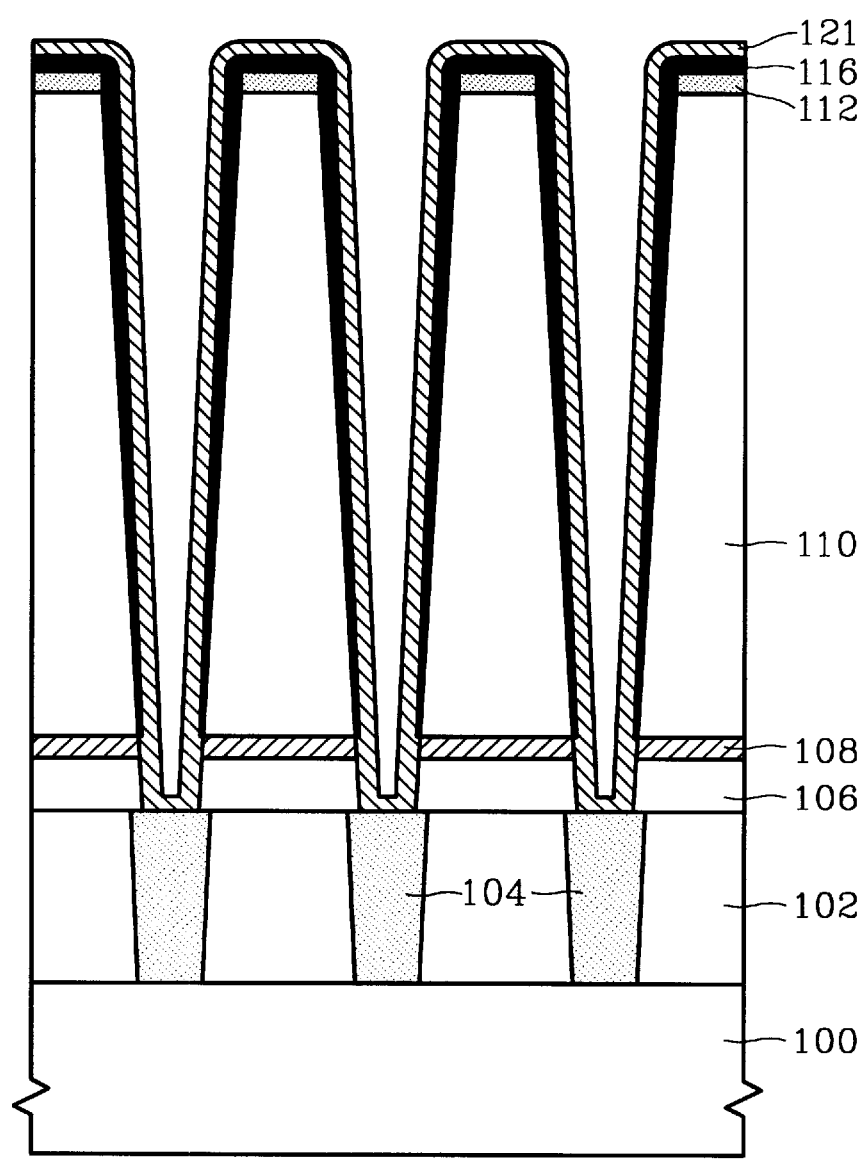

Referring to FIG. 11, a polysilicon layer or other suitable conductive layer 121 to form the cylinder-shaped lower electrodes 122 (See FIG. 12) is deposited over the resultant structure including the second opening 118 to a predetermined thickness. Thus, the slope of the layer 121 for forming cylinder-shaped lower electrodes is steeper than the slope before the layer 116 for improving sidewall slope is formed. As a result, the probability of twin bit failure can be reduced.

Figure 12:
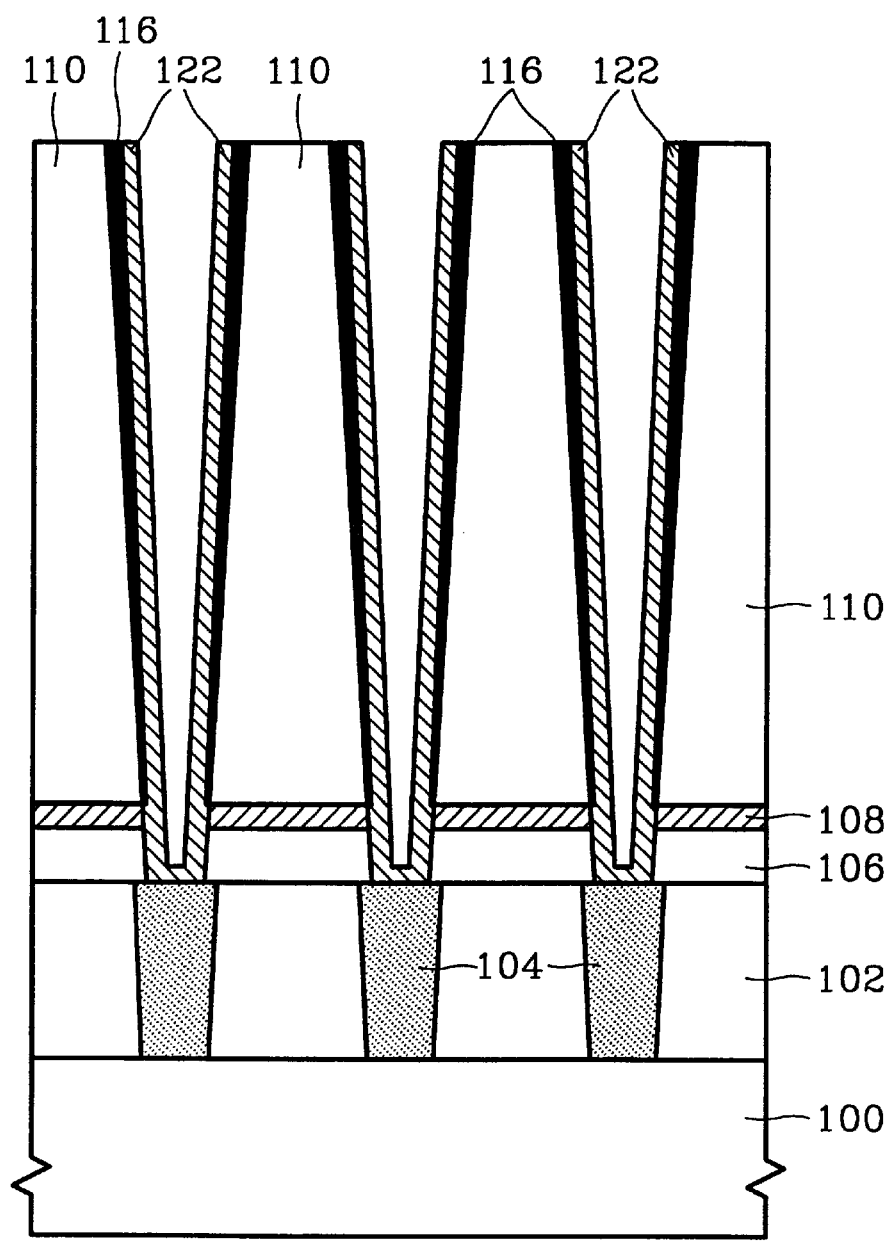

Referring to FIG. 12, portions of the layer 121 to form cylinder-shaped lower electrodes 122 over the sacrificial oxide layer 110 are removed by planarization techniques such as a chemical mechanical polishing (CMP) or an etch back process. Thus, cylinder-shaped lower electrodes 122 are formed separated from each other. Here, if the cylinder-shaped lower electrodes 122 are separated by the CMP process, the CMP process can be performed using the sacrificial oxide layer 110 as a polishing stop layer.

Figure 13:
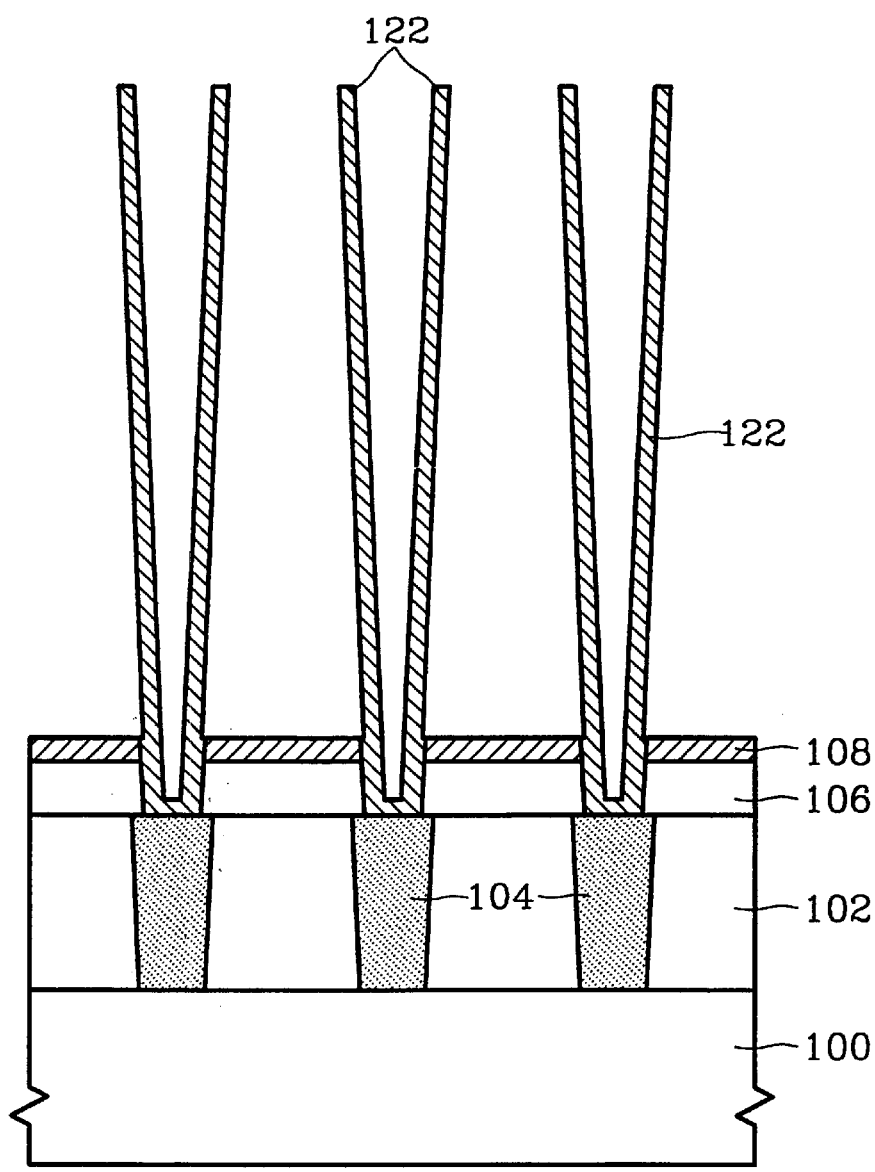

Referring to FIG. 13, wet etching is performed on the semiconductor substrate 100 on which the separated cylinder-shaped lower electrodes 122 are formed, thereby substantially completely removing the sacrificial oxide layer 110. An etching solution such as a buffered oxide etchant (BOE) can be used during the wet etching. Subsequently, the etch stopper 108 and the buffer layer 106 are removed, thereby completing the cylinder-shaped lower electrodes 122 connected to the BC 104. Thus, lower electrodes 122 of a cylinder-shaped capacitor preventing twin bit failure is completed according to a preferred embodiment of the present invention. The cylinder-shaped lower electrodes 122 according to the present invention can be widely applied to a semiconductor memory device such as a DRAM and a semiconductor device such as a merged DRAM logic (MDL) device.

Thus, with an embodiment of the present invention, the layer for improving sidewall slope having excellent gap-fill characteristics is additionally formed after the first opening for forming a cylinder-shaped capacitor is etched, thereby improving the etch slope of the first opening. Also, the etch profile for a region in which etch skew occurs is improved, and the space between cylinder-shaped lower electrodes is increased, thereby preventing twin bit failure.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A method for forming lower electrodes of a cylinder-shaped capacitor, the method comprising:
sequentially forming a buffer layer and an etch stopper on a semiconductor substrate including a conductive region;
forming a sacrificial dielectric layer on the etch stopper;
forming a first opening extending through the sacrificial dielectric layer;
depositing a slope-improving layer that improves the sidewall slope of the first opening over the sacrificial dielectric layer and within the first opening;
removing a portion of the slope-improving layer, the etch stopper and the buffer layer adjacent the first opening to form a second opening that exposes the conductive region;
forming a conductive layer over a surface of the second opening to form cylinder-shaped lower electrodes electrically coupled to the conductive region; and
removing portions of the conductive layer to form the cylinder-shaped lower electrodes separated from each other.

2. The method according to claim 1, wherein the semiconductor substrate comprises a buried contact (BC) to be electrically connected to the cylinder-shaped lower electrodes.

3. The method according to claim 1, wherein the buffer layer comprises plasma enhanced tetraethylorthosilicate (PE-TEOS).

4. The method according to claim 1, wherein the etch stopper is a layer having an etch selectivity to the sacrificial dielectric layer.

5. The method according to claim 4, wherein the etch stopper having an etch selectivity to the sacrificial dielectric layer comprises a nitride layer.

6. The method according to claim 1, wherein the sacrificial dielectric layer is one of a single layer of PE-TEOS and a multilayer including the PE-TEOS layer.

7. The method according to claim 1, which further comprises forming an etching mask comprising polysilicon over the sacrificial dielectric layer for forming the first opening.

8. The method according to claim 7, which further comprises forming an anti-reflection layer on the etching mask.

9. The method according to claim 1, wherein the layer for improving sidewall slope comprising a layer having excellent gap-fill characteristics.

10. The method according to claim 1, wherein the layer for improving sidewall slope is a layer formed by a chemical vapor deposition (CVD) method.

11. The method according to claim 1, wherein the layer for improving sidewall slope is formed to a thickness of approximately 50–500 Å.

12. The method according to claim 9, wherein the layer having excellent gap-fill characteristics is an undoped silicate glass (USG) layer.

13. The method according to claim 9, wherein the layer having excellent gap-fill characteristics is a high-density plasma (HDP) oxide layer.

14. The method according to claim 1, wherein the conductive region to which the cylinder-shaped lower electrodes is electrically connected comprises a buried contact (BC).

15. The method according to claim 1, wherein the conductive region to which the cylinder-shaped capacitor is connected comprises a source region of a transistor.

16. The method according to claim 1, wherein the cylinder-shaped lower electrodes are a cylinder-shaped lower electrode in a DRAM and a merged DRAM logic (MDL) device.

17. The method according to claim 1, wherein the removing portions of the conductive layer comprises a chemical mechanical polishing (CMP) method or an etch-back method.

18. The method according to claim 17, wherein the sacrificial dielectric layer is used as a polishing stop layer in the CMP process.

19. The method according to claim 1 further comprising removing the sacrificial dielectric layer and the layer for improving sidewall slope after forming the cylinder-shaped lower electrodes separated from each other.

20. The method according to claim 19, wherein the removing the sacrificial dielectric layer and the layer for improving sidewall slope is performed by wet etching.

* * * * *